(12) United States Patent
Schott et al.

(10) Patent No.: US 9,543,504 B2
(45) Date of Patent: Jan. 10, 2017

(54) VERTICAL HALL SENSORS WITH REDUCED OFFSET ERROR

(71) Applicants: Melexis Technologies NV, Tessenderlo (BE); X-FAB Semiconductor Foundries AG, Erfurt (DE)

(72) Inventors: Christian Schott, Lussy-sur-Morges (CH); Peter Hofmann, Radeberg (DE)

(73) Assignees: MELEXIS TECHNOLOGIES NV, Tessenderl O (BE); X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 14/918,704

(22) Filed: Oct. 21, 2015

(65) Prior Publication Data
US 2016/0111631 A1   Apr. 21, 2016

(30) Foreign Application Priority Data
Oct. 21, 2014   (GB) .................................. 1418662.1

(51) Int. Cl.
| | | |
|---|---|---|
| *H01L 43/14* | (2006.01) | |
| *G01R 33/07* | (2006.01) | |
| *H01L 43/06* | (2006.01) | |
| *H01L 43/04* | (2006.01) | |

(52) U.S. Cl.
CPC ............. *H01L 43/065* (2013.01); *G01R 33/07* (2013.01); *G01R 33/077* (2013.01); *H01L 43/04* (2013.01); *H01L 43/14* (2013.01)

(58) Field of Classification Search
CPC ........ H01L 43/065; H01L 43/14; H01L 43/04; G01R 33/077; G01R 33/07; G01R 33/06
See application file for complete search history.

(56) References Cited

U.S. PATENT DOCUMENTS

| | | | | |
|---|---|---|---|---|
| 4,829,352 A | * | 5/1989 | Popovic | .................. H01L 27/22 257/426 |
| 5,548,151 A | | 8/1996 | Funaki et al. | |

(Continued)

FOREIGN PATENT DOCUMENTS

| | | |
|---|---|---|
| EP | 1 540 748 A1 | 6/2005 |
| EP | 2 546 670 A2 | 1/2013 |

OTHER PUBLICATIONS

Great Britain Search Report from Application No. GB1418662.1, Mar. 25, 2015.

(Continued)

*Primary Examiner* — Nikolay Yushin
(74) *Attorney, Agent, or Firm* — Workman Nydegger

(57) ABSTRACT

A semiconductor chip for measuring a magnetic field based on the Hall effect. The semiconductor chip comprises an electrically conductive well having a first conductivity type, in a substrate having a second conductivity type. The semiconductor chip comprises at least four well contacts arranged at the surface of the well, and having the first conductivity type. The semiconductor chip comprises a plurality of buffer regions interleaved with the well contacts and having the first conductivity type. The buffer regions are highly conductive and the buffer region dimensions are such that at least part of the current from a well contact transits through one of its neighboring buffer regions.

14 Claims, 7 Drawing Sheets

(56) References Cited

U.S. PATENT DOCUMENTS

| | | |
|---|---|---|
| 6,683,448 B1 * | 1/2004 | Ohtsuka ............... H01L 43/065 257/E43.003 |
| 7,872,322 B2 | 1/2011 | Schott et al. |
| 9,097,753 B2 | 8/2015 | Raz et al. |
| 2006/0011999 A1 | 1/2006 | Schott et al. |
| 2010/0133632 A1 | 6/2010 | Schott |
| 2012/0241887 A1 | 9/2012 | Schott et al. |
| 2013/0021027 A1 | 1/2013 | Ausserlechner |
| 2014/0210023 A1 | 7/2014 | Wang |

OTHER PUBLICATIONS

European Search Report from EP Application No. 15190681.5, Mar. 15, 2016.

* cited by examiner

VERTICAL HALL SENSORS WITH REDUCED OFFSET ERROR

FIELD OF THE INVENTION

The present invention relates to the field of vertical Hall sensors. More specifically, it relates to a system with limited, e.g. reduced, offset error for measuring a magnetic field and to a method for manufacturing such system.

BACKGROUND OF THE INVENTION

Vertical Hall sensors have the advantage that they can be manufactured using conventional semiconductor technology (e.g. CMOS). They have, however, the disadvantage that they suffer from a relatively high offset voltage compared to horizontal Hall sensors. The offset voltage is the voltage measured when no magnetic field is present.

The measurement error due to offset voltage can be decreased by several techniques, such as for instance the spinning current technique. In this technique, the supply and readout contacts are cyclically interchanged. In one phase the offset is then added to the magnetic signal with positive sign and in the other phase with negative sign. By averaging both phases, the offset can typically be reduced more than 100 times.

A Hall sensor may be represented as a distributed resistive Wheatstone bridge. In order for the spinning current technique to be effective it is important that electrical symmetry exists within the vertical Hall sensor (i.e. that all resistors in the resistive Wheatstone bridge have about the same value). A vertical Hall element, however, does not provide this electrical symmetry by default since all contacts are on one side and since the active area (e.g. an n-well) only has a limited depth. Therefore, in practice, rather than a factor 100, the offset is only reduced by a factor 5-10 after applying the spinning current technique. Moreover, the residual offset is temperature dependent and the dependency is non-linear. This requires a time consuming calibration procedure.

EP1540748 discloses a magnetic field sensor with a Hall element that has two inner and two outer contacts arranged along a straight line. The contacts are arranged on the surface of a well of a first conductivity type embedded in a substrate of a second conductivity type. A first of the two outer contacts and a first of the two inner contacts which are not adjacent contacts act as supply contacts to which a current can be applied, and the second of the two outer contacts and the second of the two inner contacts act as sense contacts for tapping a Hall voltage. A first resistance is provided between the first contact and the second contact, a second resistance is provided between the second and the third contact, a third resistance is provided between the third and the fourth contact, and a fourth resistance is provided between the first and the fourth contact. The resistance values of the first, second and third resistances are substantially equal. An additional resistance is furthermore provided, coupled in parallel to the fourth resistance, and having a resistance value selected such that the parallel resistance value of the fourth and the additional resistance is substantially equal to the resistance value of any of the first, second or third resistances. This way, the equivalent Wheatstone resistor bridge is balanced. With proper dimensioning of the additional resistor this works and can reduce to zero the residual offset after spinning. However, this works only at one fixed operation condition concerning biasing voltage and temperature. If any of these two parameters varies, the matching is disturbed by additional effects arising from the non-perfect symmetry between inside and outside contacts, leading to a strong increase of the residual offset.

The minimum magnetic flux density which can be accurately measured depends on the offset error of the vertical Hall sensor: the smaller the offset error, the more accurately a magnetic flux density can be measured. Therefore, in view of the difficulty in reducing offset errors, there is still room for improvement in vertical Hall sensors.

SUMMARY OF THE INVENTION

It is an object of embodiments of the present invention to provide a system for sensitive and accurate magnetic field measurements based on the Hall effect. The above objective is accomplished by a method and a device according to the present invention.

In a first aspect, the present invention provides a semiconductor chip for measuring a magnetic field based on the Hall effect. The semiconductor chip comprises:
an electrically conductive well having a first conductivity type, in a substrate having a second conductivity type,
at least four well contacts arranged at the surface of the well, and having the first conductivity type,
a plurality of buffer regions interleaved with the well contacts, and having the first conductivity type.

The buffer regions are highly conductive with a conductivity that may be ranging between 5 Ohm/sq and 100 Ohm/sq for shallow buffers and between 100 Ohm/sq and 1000 Ohm/sq for deep buffers. The buffer region dimensions are such that at least part of the current from a well contact to another well contact transits through one of its neighboring buffer regions.

It is an advantage of embodiments of the present invention that the offset error is reduced by introducing highly conductive buffer regions through which the currents between well contacts flows. These buffer regions introduce zones of equal potential in the electrically conductive well and thereby provide an increased electrical symmetry compared to other vertical Hall sensors lacking the buffer regions. In embodiments of the present invention any current from a well contact transits through one of its neighboring buffer regions. It is an advantage of embodiments of the present invention that the surroundings of the well contacts are made equal. This "potential buffer" concept makes it irrelevant whether the current is running from one contact to its neighboring contact or from one external contact to the opposite external contact. In embodiments of the present invention the buffer regions are not electrically connected from outside the semiconductor chip. Therefore, in these embodiments, a floating self-adjusting potential exists for each buffer region. It is an advantage of embodiments of the present invention that symmetry in the sensor allows to decrease the offset voltage. In embodiments of the present invention the symmetry is increased by introducing buffer regions in between the well contacts. It is an advantage of embodiments of the present invention that electrical symmetry is realized on a single Hall element by introducing highly conductive zones in between them. When in prior art solutions multiple Hall elements are used, this has the disadvantage with regard to embodiments of the present invention that they have to be spaced further from each other to avoid connection of the wells and that the prior art solution is more sensitive for a good alignment between the contacts which could compromise good matching. It is an advantage of embodiments of the present invention that the offset error can be reduced, after spinning, with a factor between 20 and 100 independent of the temperature and biasing conditions. It is an advantage of embodiments of the present invention that they are applicable in multiple operation conditions (e.g. biasing voltage) and temperatures.

In a semiconductor chip according to embodiments of the present invention the regions in between the well contacts and the buffer regions and/or the regions outside the outer buffer regions or well contacts are filled with dielectric material, such as oxide.

In a semiconductor chip according to embodiments of the present invention the regions in between the well contacts and the buffer regions and/or the regions outside the outer buffer regions or well contacts are covered by a thin dielectric, for instance oxide, layer with a polysilicon layer on top.

It is an advantage of embodiments of the present invention that the polysilicon and/or dielectric regions may serve as masking regions for the first conductivity type (e.g. n+) implant step. Through the first conductivity type (e.g. n+) implant step the well contacts and buffer regions are realized. During operation, the polysilicon or dielectric regions are the drift regions between the well contacts and buffer regions.

A semiconductor chip according to embodiments of the present invention may comprise a buffer region outside each of the outer well contacts, wherein the buffer region outside the outer well contacts is having the first conductivity type and is highly conductive and wherein the buffer region is at least as wide as the other buffer regions and wherein the two outer buffer regions are electrically connected together on a floating potential.

It is an advantage of embodiments of the present invention that the electrical symmetry is increased by adding highly conductive buffer regions outside the outer well contacts.

A semiconductor chip according to embodiments of the present invention, may comprise at least six well contacts. It is an advantage of embodiments of the present invention that the electrical symmetry may be increased by having more than five well contacts.

In a semiconductor chip according to embodiments of the present invention, the well contacts and buffer regions may be circular.

In a semiconductor chip according to embodiments of the present invention, the distance between two neighboring buffer regions may be the same for all neighboring buffer regions and the dimensions of a buffer region may be the same for all buffer regions. It is an advantage of embodiments of the present invention that electrical symmetry can be realized through geometrical symmetry. It is an advantage of embodiments of the present invention that the electrical and geometrical symmetry is reproducible and that the process sensitivity is decreased.

In a semiconductor chip according to embodiments of the present invention, the distance between two neighboring well contacts may be the same for all neighboring well contacts and the dimensions of a well contact are the same for all well contacts.

In a semiconductor chip according to embodiments of the present invention, the buffer regions are extending to the same depth into the electrically conductive well as the well contacts. In embodiments according to the present invention the depth of the buffer regions may be between 2 to 3 times the depth of the electrically conductive wells. The buffer regions may be as deep as possible.

It is an advantage of embodiments of the present invention that the buffer regions extend so deep into the electrically conductive well that a majority of the currents, for instance more than 90% of the currents, such as all currents, between the well contacts go through the buffer regions.

In embodiments of the present invention, the buffer regions may have a width between the width of the well contacts and twice the depth of the electrically conductive well. The buffer regions may for example be between 6 and 20 times wider than the well contacts. It is an advantage of embodiments of the present invention that the buffer regions are so wide that all currents between the well contacts go through the buffer regions.

In embodiments of the present invention, the buffer regions neighboring the outer well contacts may form one entire buffer region surrounding the outer well contact. It is an advantage of embodiments of the present invention that the electrical symmetry is increased when the outer well contacts are embedded in buffer regions.

In a semiconductor chip according to embodiments of the present invention, the well contacts may be extended using well contact extensions having the first conductivity type. It is an advantage of embodiments of the present invention that the well contact extensions provide a contact between the well contacts, having for example a strong retrograde profile, and the deep well regions of higher conductivity.

In a second aspect, the present invention provides a method for manufacturing a semiconductor chip, for instance a semiconductor chip according to embodiments of the present invention, suitable for measuring a magnetic field based on the Hall effect. In the method, applying the well contacts and applying the buffer regions involves the same processing step or processing steps. It is an advantage of embodiments of the present invention where shallow buffer regions are implemented, that no additional processing steps are required for implementing the buffer regions. It is an advantage of embodiments of the present invention that the shallow buffers are self-aligned with the well contacts because they are implemented in the same processing step or processing steps.

In methods according to embodiments of the present invention, the following steps may be applied:
in a first step shallow trench isolation is applied, and
in a next step a first conductivity type implant is applied on the regions not covered by the shallow trench isolation.

In methods according to embodiments of the present invention, the following steps may be applied:
in a first step a thin dielectric layer is applied,
in a next step polysilicon is applied over the dielectric layer,
thereafter, the dielectric layer and the polysilicon are etched away where the well contacts and the buffer regions will later be formed, and then
a first conductivity type implant is applied on the regions not covered by the polysilicon layer.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described hereinabove. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

Figure 1:
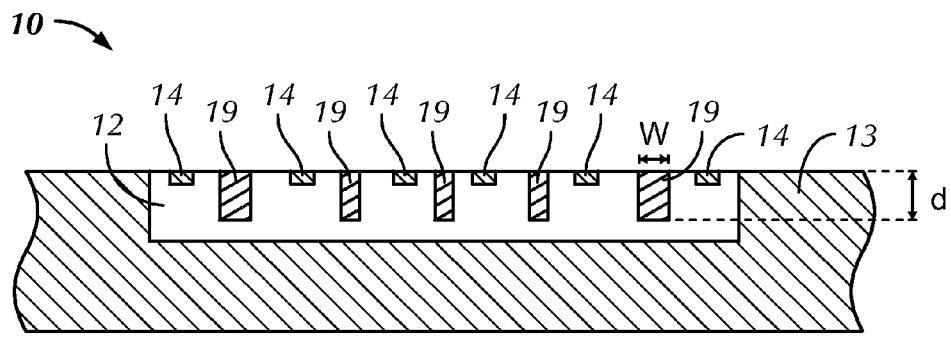
FIG. 1 provides a schematic vertical cross-section of a vertical Hall sensor with deep buffer regions in accordance with a first embodiment of the present invention.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Figure 13:
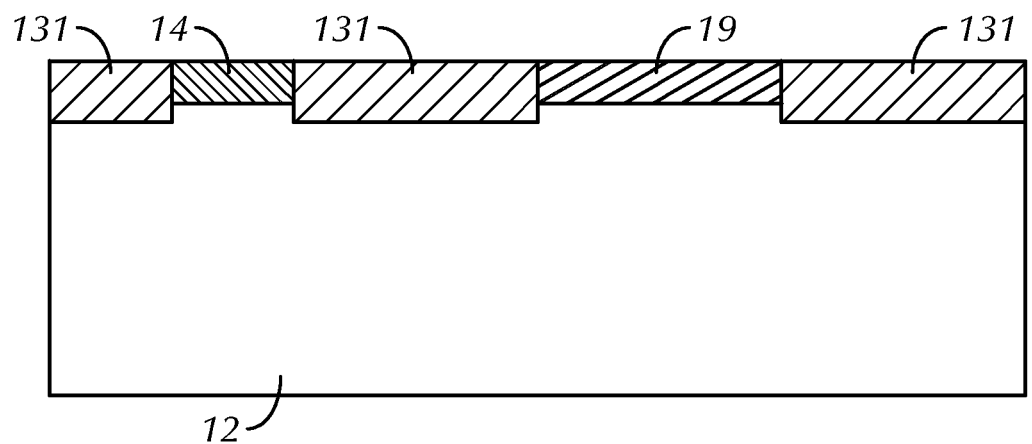

FIG. 13 provides a schematic vertical cross-section of a vertical Hall sensor wherein shallow trench isolation 131 serves as a mask for the implant step for the well contacts and the buffer regions in accordance with embodiments of the present invention.

Figure 14:
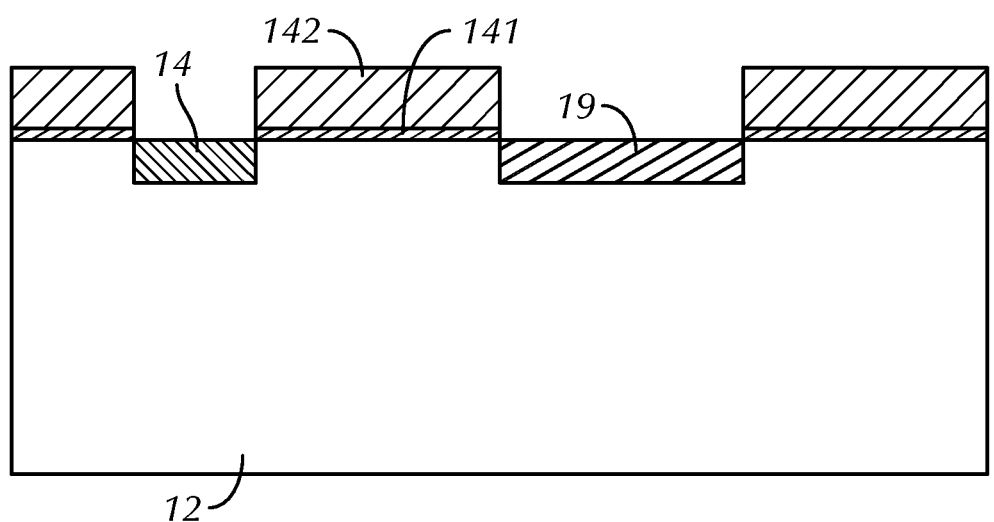

FIG. 14 provides a schematic vertical cross-section of a vertical Hall sensor wherein the regions in between the well contacts and the buffer regions and/or wherein the regions outside the outer buffer regions or well contacts are covered by a thin oxide layer with a polysilicon layer on top.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to the "depth" of the well contact or of the buffer region the depth is measured in a direction orthogonal to the substrate surface.

Where in embodiments of the present invention reference is made to the "length" of the well contact or of the buffer region the length is measured orthogonal to the depth direction and along the length of the well contact or of the buffer region.

Where in embodiments of the present invention reference is made to the "width" of the well contact or of the buffer region, the width is measured orthogonal to the depth direction and orthogonal to the length direction.

Where in embodiments of the present invention reference is made to the "outer well contacts", reference is made to the two outer well contacts of an array of substantially parallel well contacts. Hereby the well contacts are elongated well contacts and they are parallel in their elongated direction. All the other well contacts are the inner well contacts.

In a first aspect, the present invention relates to a semiconductor chip 10 for measuring a magnetic field based on the Hall effect.

According to embodiments of the present invention, the semiconductor chip 10 for measuring a magnetic field based on the Hall effect, also called a Hall sensor in this description, comprises an electrically conductive well 12 having a first conductivity type, in a substrate 13 having a second conductivity type. In embodiments of the present invention, without being limited thereto, the first conductivity type of the electrically conductive well 12 is n-type whereas the second conductivity type of the substrates 13 is p-type. In embodiments of the present invention the doping level of the p-type substrate 13 is about 1e15. In embodiments of the present invention the doping level of the n-type well 12 is between 1e16 and 5e16. The profile of the doping level maybe constant or increasing with the depth (i.e. retrograde).

The semiconductor chip 10 furthermore comprises at least four well contacts 14 arranged at the surface of the well 12 which have the first conductivity type, n-type in the example given above. The semiconductor chip 10 may have an even well contact count or an odd well contact count.

When having four well contacts only an electrically non-symmetrical configuration can be obtained. In a symmetrical Hall configuration all resistors in the resistive Wheatstone bridge have a similar value.

In case of an even number of at least six well contacts, the number being (N×4+2) (e.g. 6, 10, 14, 18), the well contacts may be arranged in N groups of 4 contacts. When having an even number of at least six well contacts, the outer well contacts may be connected by a metal line which is left floating (non-biased outer well contacts). In the case of at least six well contacts, all well contacts except for the outer ones may be grouped in groups of four well contacts. The first well contacts of each group may be electrically interconnected, the second well contacts of each group may be electrically interconnected, the third well contacts of each group may be electrically interconnected and the fourth well contacts of each group may be electrically interconnected. For example when numbering the 16 inner well contacts of a group of 18 well contacts consecutively this results in a first group (1-4), a second group (5-8), a third group (9-12), and a fourth group (13-16). The outer well contacts of the configuration may be electrically interconnected and the first well contacts (1,5,9,13) of each group may be electrically interconnected, and the second well contacts (2,6,10,14) of each group may be electrically interconnected etc.

In embodiments of the present invention the well contacts 14 are interconnected to result in four groups of well contacts independent of the total number of well contacts. In the examples below the contacts are numbered consecutively.

In a sensor with five well contacts, the first and fifth well contacts might be interconnected.

In a sensor with 9 well contacts, well contacts 1-5-9, 2-6, 3-7, 4-8 might be interconnected.

In a sensor with 17 well contacts, well contacts 1-5-9-13-17, 2-6-10-14, 3-7-11-15, 4-8-12-16 might be interconnected.

In these embodiments the first well contact is connected with the n×4+1 well contact(s), the second well contact is connected with the n×4+2 well contacts, the third well contact is connected with the n×4+3 well contacts, and the fourth well contact is connected with the n×4+4 well contacts (as long as well contacts are present). Hereby n is an integer ranging from 1 to N whereby N×4 is smaller than or equal to the number of well contacts and (N+1)×4 is bigger than the number of well contacts. This mapping will be referred to as modulo 4 mapping.

The well contacts 14 may be elongated strips of conductive material on or in the surface of the well 12, arranged adjacent one another. The well contacts 14 may be located substantially parallel to one another in their elongated direction. This way, an array of well contacts 14 is provided of which two well contacts 14 are outer well contacts, and all the other ones are inner well contacts. At least two of the well contacts 14, in use, function as supply contacts for receiving current and injecting it into the well 12, while at least two of the well contacts 14, in use, function as sense contacts to deliver a sense signal representative for a measured magnetic field. A plurality of buffer regions 19 is provided in between the well contacts 14, and optionally also outside the region where the outer well contacts are provided. These buffer regions 19 are conductive regions. The buffer regions 19 may be semiconductive regions also having the first conductivity type, n-type in the example given above. In embodiments of the present invention the buffer regions may be metallic. The buffer regions 19 are highly conductive with a conductivity that may be ranging between 5 Ohm/sq and 100 Ohm/sq for shallow buffers and with a conductivity that may be ranging 100 Ohm/sq and 1000 Ohm/sq for deep buffers, and their dimensions are such that at least part of the current from a well contact 14 to another, for instance a neighboring, well contact 14 transits through one of its neighboring buffer regions 19.

In use, an unknown magnetic field may be applied perpendicular to the surface of the chip 10. A bias current is injected into the conductive well 12 from a central well contact 14, and is symmetrically collected by ground terminals at the left and right hand sides of the device. The current path goes down from the central terminal, and reaches across the chip 10 and back up to the ground terminals.

By introducing the buffer regions 19 in the semiconductor chip 10, interleaved with the well contacts, geometrical and electrical symmetry is created in the resistance values between the well contacts 14. Therefore it is an advantage of embodiments of the present invention that the residual offset error of the vertical Hall element can be reduced by applying a spinning current method. When applying spinning, the well contacts are configured to alternatingly function as supply contacts for current injection and as sense contacts for voltage sensing. Because of the electrical symmetry the offset error can be eliminated by processing the subsequent measurement results. Because of the geometrical symmetry, the electrical symmetry can be maintained for a wide range of bias and temperature conditions (for example a temperature ranging from −50° C. to 200° C. and a bias between 1 V and 4 V).

Figure 2:
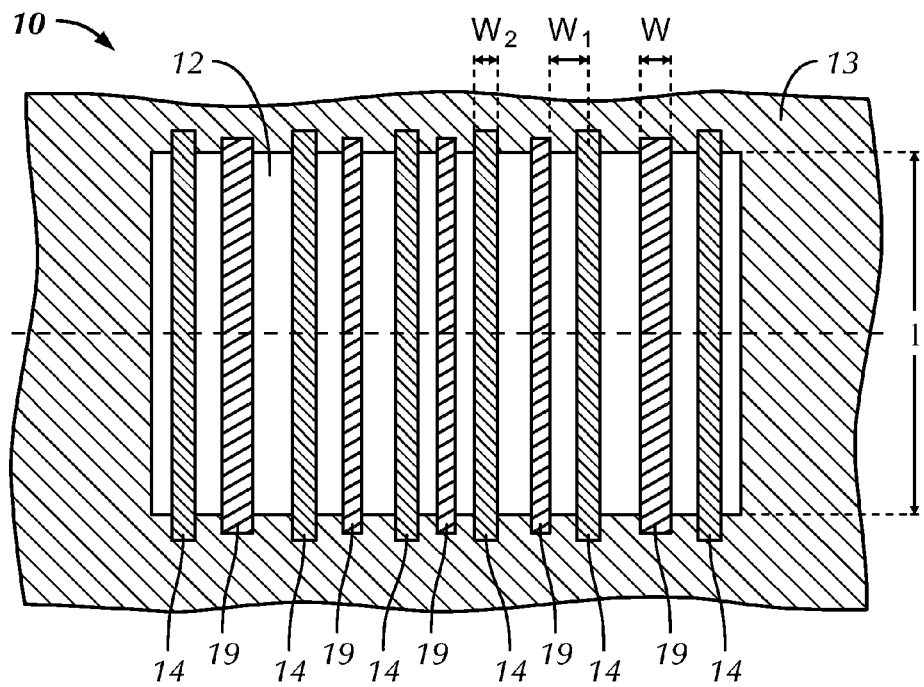
FIG. 2 provides a schematic top view of the vertical Hall sensor of FIG. 1 with deep buffer regions in accordance with embodiments of the present invention.

FIG. 1 and FIG. 2 illustrate a vertical cross-section and a top view, respectively, of a Hall sensor 10 according to an exemplary embodiment of the present invention, wherein the Hall sensor 10 has six well contacts 14 and five buffer regions 19 interleaved with, and thus distributed in between, the well contacts 14, one buffer region 19 in between every two neighboring well contacts 14. Embodiments of the present invention, however, are not limited to this number of well contacts 14 and buffer regions 19. The well contacts 14 and the buffer regions 19 are arranged such that an array of alternating well contacts 14 and buffer regions 19 is obtained. Of the well contacts 25, for instance the first, third, fourth and sixth may be supply contacts, and the second and fifth may be sense contacts. It can be seen that in this case the central supply contact consists of the third and fourth well contact, and thus is implemented as a distributed contact. This, however, is not intended to be limiting for the present invention.

In the exemplary embodiment of FIG. 1 and FIG. 2, the depth dimension of the buffer regions 19, in a direction perpendicular to the surface of the substrate 13, is such that they are extending deeper into the electrically conductive well 12 than the well contacts 14. Such buffer regions are further called "deep buffer regions". The depth of the deep buffer regions 19 might for example be 1.0 µm in case of a conductive well 12 with a depth between 3 and 4 µm. In embodiments of the present invention the width (w in FIG. 2) of the buffer regions is between 6 and 10 µm, more preferably between 7 and 9 µm, more preferably 8 µm. In embodiments of the present invention the width (w in FIG. 2) of a shallow highly doped buffer region is about two times the depth of the conductive well 12. In embodiments of the present invention the outer well contacts 14 (the symmetrization contacts) are larger than the inner well contacts 14. In embodiments of the present invention the distance between the center of a well contact 14 and the closest edge of the neighboring buffer region 19 ($w_1$ in FIG. 2) is between 1 and 4 µm, more preferably between 1.5 and 3 µm, more preferably between 1.5 and 2 µm, more preferably about 2 µm. In embodiments of the present invention $2 \times w_1$ has almost the same size as the depth of the conductive well 12, which may be for instance between 3 and 4 µm. In embodiments of the present invention the width w of the buffer region 19 is about $4 \times w_1$. In embodiments of the present invention the width of a well contact 14 ($w_2$ in FIG. 2) ranges between 0.2 µm and 1.0 µm, preferably between 0.4 µm and 0.7 µm.

In embodiments of the present invention the spacing between two neighboring well contacts 14, from the middle of one well contact 14 towards the middle of the neighboring well contact 14 minus the width of the buffer region 19 in between both contacts varies between 2 and 4 µm, preferably between 3 and 4 µm. This distance is referred to as the "effective distance". The buffer width is subtracted because it does not significantly contribute to the resistance of the path between the two neighboring well contacts. The region through which the electrons or holes, depending on the first conductivity type, travel over the "effective distance" (i.e. the region between the well contact and the buffer region) is also called the drift region. In embodiments of the present invention the depth of the well 12 has a similar depth as the effective distance between two neighboring well contacts 14. This has as advantage that it results in the best trade-off between accuracy and sensitivity. The ideal well depth would be infinite though. In embodiments of the present invention the width of a buffer region 19 is preferably about twice the effective distance between two neighboring well contacts 14.

In embodiments of the present invention the distance between two neighboring well contacts 14 ranges between 1 and 10 µm.

Figure 3:
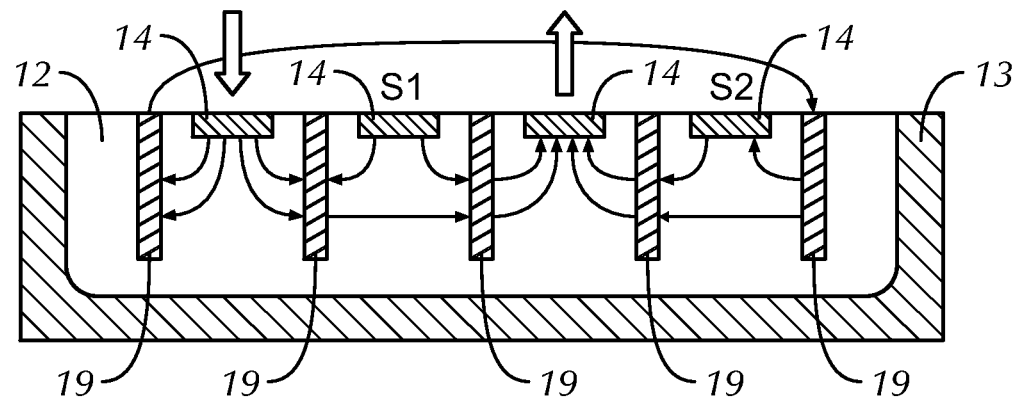
FIG. 3 provides a schematic vertical cross-section of a vertical Hall sensor with deep buffer regions in accordance with embodiments of the present invention.

In another exemplary embodiment, illustrated in FIG. 3, the semiconductor chip 10 comprises 4 well contacts 14. Such a semiconductor chip 10 can be electrically represented as a Wheatstone bridge. The well contacts 14 are configured to alternatingly function during spinning as current injection contacts and as voltage measurement contacts. In the configuration illustrated in FIG. 3, the well contacts indicated S1 and S2 are the sense contacts or voltage measurement contacts while the other two contacts are the supply or current injection contacts. In the configuration illustrated in FIG. 3, the arrows indicate currents.

If the four resistance values in the Wheatstone bridge, formed by the semiconductor material in between two neighboring well contacts 14, are of about equal size, the offset error of a Hall measurement can be cancelled out by the spinning method. As explained above the well contacts may be mapped in 4 separate groups of connected well contacts using a modulo 4 mapping. It is an advantage of embodiments of the present invention that the resistance value between each of these groups can be made equal. The maximum difference between resistance sizes is below 1% of the average resistance value, preferably below 0.1% of the average resistance value. A vertical Hall element typically has a difference in resistance sizes between 1% and 0.1% resulting in an offset reduction by a factor of 5 to 10 by the spinning technique, whereas in horizontal Hall sensors the spinning technique can result in a offset reduction with a factor 100 or more.

In a prior art solution as disclosed in EP2546670, the difference between resistance values in a vertical Hall sensor is reduced by electrically isolating the well contacts and afterwards reconnecting them. It is an advantage of embodiments of the present invention that it is not required to electrically isolate the well contacts 14, as electrically isolating the well contacts 14 requires more space compared to embodiments of the present invention. Typically 30% less space will be required. Moreover, embodiments of the present invention are less sensitive to alignment errors.

The buffer regions (e.g. in FIG. 1, FIG. 2, FIG. 3, FIG. 4) create zones of equal potential within the conductive well 12 of the sensor. The buffer regions create a geometrical and electrical symmetry of the sense contacts S1 and S2 with respect to the supply contacts.

While in the embodiment illustrated in FIG. 1 and FIG. 2 each buffer region 19 is provided in between two well contacts 14, in the embodiment illustrated in FIG. 3 each well contact 14 is provided in between two buffer regions 19. Hence embodiments of the present invention may comprise at least one buffer region 19 outside the outer well contacts 14. The embodiment illustrated in FIG. 3 has two buffer regions outside the outer well contacts 14.

Figure 5:
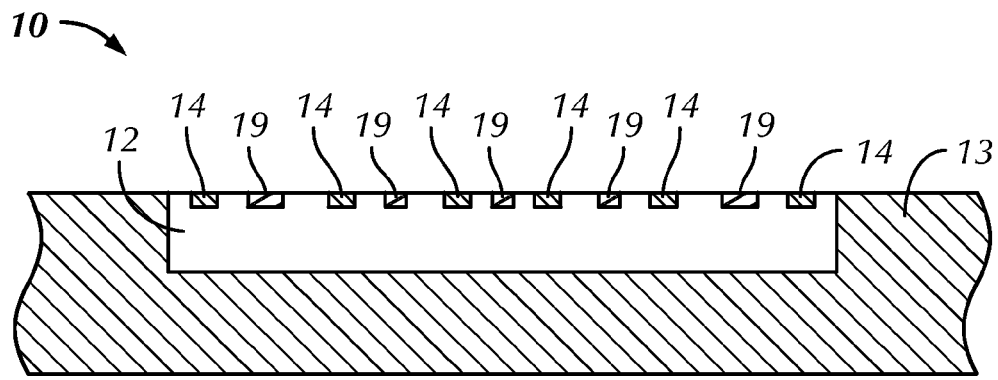
FIG. 5 provides a schematic vertical cross-section of a vertical Hall sensor with wide buffer regions in accordance with embodiments of the present invention.
Figure 6:
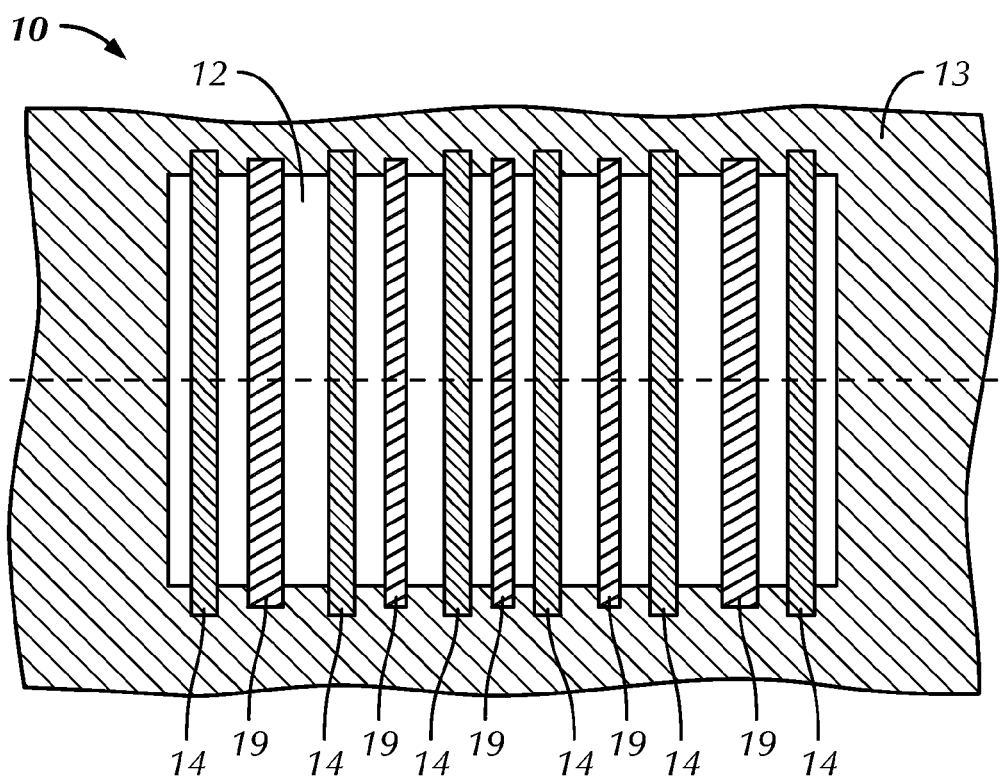
FIG. 6 provides a schematic top view of the vertical Hall sensor of FIG. 5 with wide buffer regions in accordance with embodiments of the present invention.

FIG. 5 and FIG. 6 schematically illustrate a vertical cross-section and a top view, respectively, of a Hall sensor 10 according to another embodiment of the present invention, comprising buffer regions 19 in between well contacts 14. The Hall sensor 10 illustrated has six well contacts 14 and five buffer regions 19 distributed in between the well contacts 14, one buffer region 19 in between every two neighboring well contacts 14. The buffer regions 19 and well contacts 14 are arranged in an array of alternating well contacts 14 and buffer regions 19.

Figure 4:
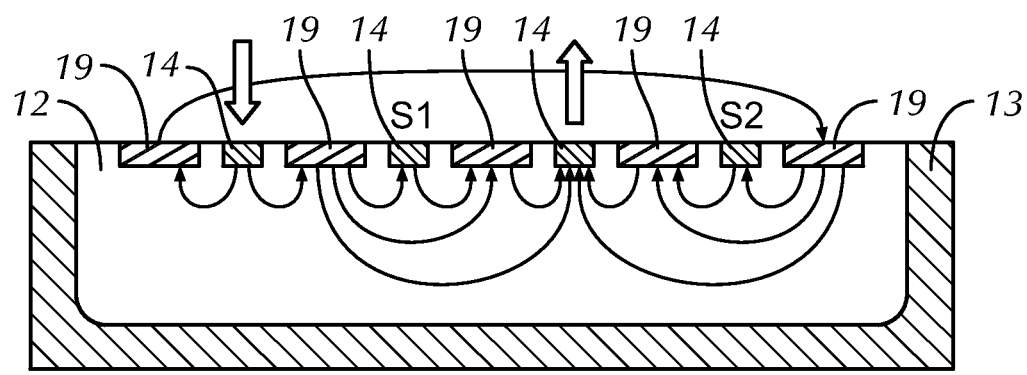
FIG. 4 provides a schematic vertical cross-section of a vertical Hall sensor with wide buffer regions in accordance with embodiments of the present invention.

Also FIG. 4 shows a cross-section of an exemplary embodiment of the present invention comprising buffer regions 19. In this embodiment, four well contacts 14 are provided, and five buffer regions 19. The well contacts and buffer regions are laid out in an array of alternating buffer regions and well contacts, there being a well contact in between every two neighboring buffer regions 19. Also in the exemplary embodiment illustrated in FIG. 4 the buffer regions 19 create a geometrical and electrical symmetry of the sense contacts S1 and S2 with respect to the supply contacts.

Figure 7:
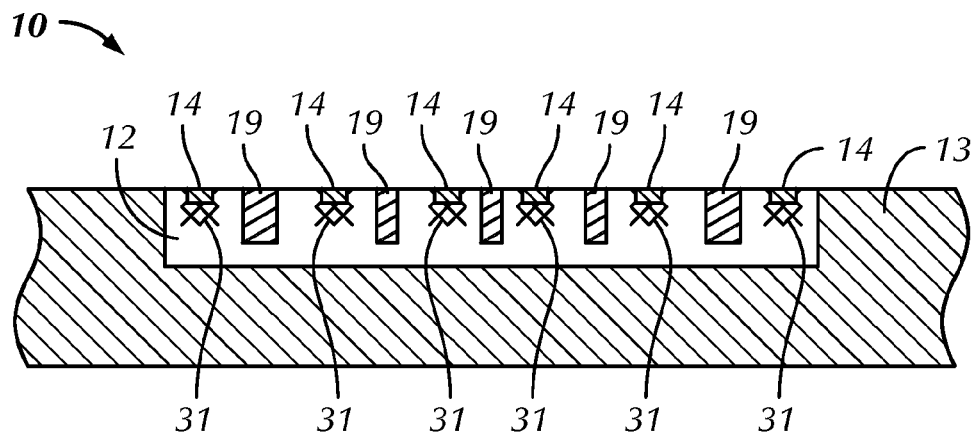
FIG. 7 provides a schematic vertical cross-section of a vertical Hall sensor with deep buffer regions and well contact extensions in accordance with a second embodiment of the present invention.
Figure 8:
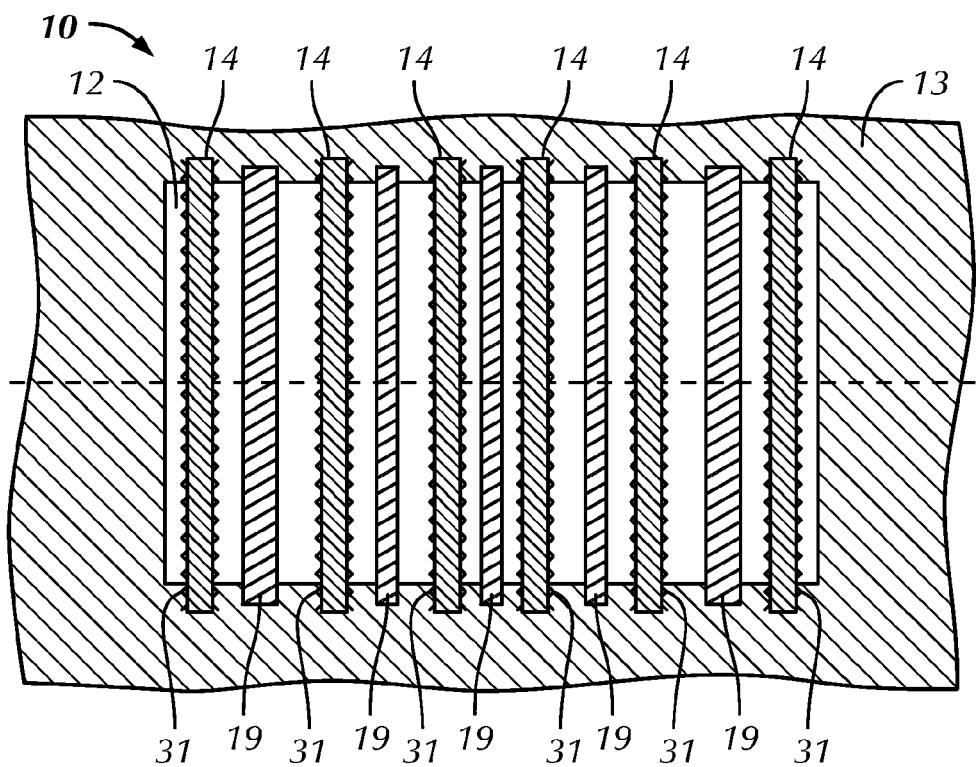
FIG. 8 provides a schematic top view of the vertical Hall sensor of FIG. 7 with deep buffer regions and well contact extensions in accordance with embodiments of the present invention.

In embodiments of the present invention, the well contacts 14 are extended using well contact extensions 31. The well contact extensions 31 have the first conductivity type. In embodiments according to the present invention the well contact extensions are formed in an additional independent process step. In embodiments according to the present invention the extensions have a doping level between 1e17 and 1e18, and a depth between 1 and 2 µm. FIG. 7 illustrates a vertical cross-section of an exemplary embodiment of the present invention comprising well contact extensions 31. FIG. 8 illustrates the top view of the same exemplary embodiment.

Figure 9:
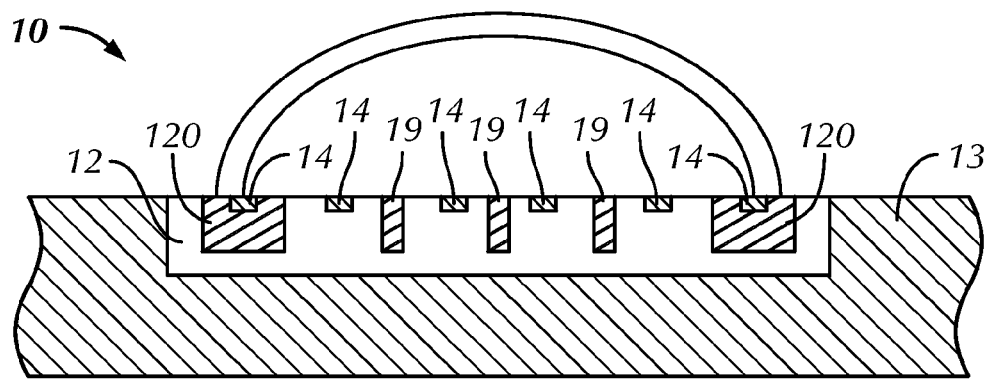
FIG. 9 provides a schematic vertical cross-section of a vertical Hall sensor according to a fourth embodiment of the present invention, with deep buffer regions, and wherein the outer symmetrization well contacts lie inside the buffer regions.

In embodiments of the present invention the buffer regions 19 neighboring the outer well contacts 14 at both sides thereof form one entire buffer region 120 surrounding the outer well contact 14. When in embodiments of the present invention reference in general is made to buffer regions 19 also the surrounding buffer regions 120 are considered. In an exemplary embodiment of which the cross-section is illustrated in FIG. 9 and the top view in FIG. 10, the buffer regions 19 neighboring the outer well contacts 14 form one entire buffer region 120 per outer well contact. In embodiments of the present invention the distance ($w_3$ in FIG. 10) from the edge of the surrounding buffer 120 region towards the nearest edge of the surrounded well contact should be close to half of the buffer width w between the inner contacts (e.g. 0.4 w<$w_3$<0.6 w or more preferably 0.45 w<$w_3$<0.55 w). In embodiments of the present invention the distance ($w_4$ in FIG. 10) between the nearest edge of the surrounding buffer region 120 towards the center of the nearest well contact is equal to or slightly smaller than $w_1$ (the distance between the center of a well contact 14 and the closest edge of the neighboring buffer region 19). The distance $w_4$ might for example be 10% smaller than $w_1$. The distance $w_4$ might for example be less than 0.1 µm smaller than $w_1$. The distance $w_4$ might be between 1 and 3 µm, preferably around 2 µm. The outer well contacts 14 are also referred to as the symmetrization well contacts. They are electrically connected to one another, and make sure that the current does not feel any difference between going from one well contact to a neighboring well contact, and going from a well contact at one edge of the sensor to a well contact at the other edge of the sensor. For example in an embodiment with 6 well contacts (numbered consecutively), the outer symmetrization well contacts enable the same current path between the second and fifth well contact through the first and sixth well contact as between the second and third or third and fourth well contact. In this example the path between the second and fifth well contact via the first and sixth well contact comprises:

firstly a drift region over a width $w_4$ which is preferably equal to or slightly smaller than $w_1$, secondly a buffer region with a width $w_3$ which is preferably equal to or slightly smaller than 0.5w, thirdly a metal line between the first and sixth well contact, fourthly a buffer region with a width $w_3$ which is preferably equal to or slightly smaller than 0.5w finally a drift region over a width $w_4$ which is preferably equal to or slightly smaller than $w_1$.

Figure 10:
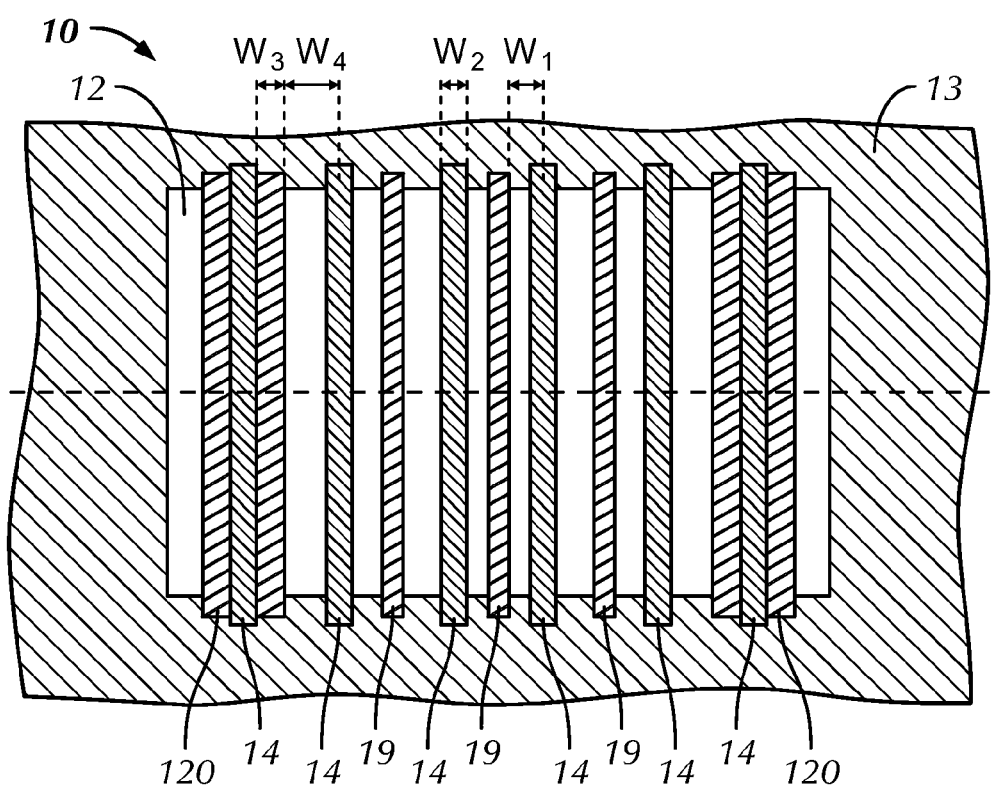
FIG. 10 provides a schematic top view of the vertical Hall sensor of FIG. 9 with deep buffer regions, and wherein the outer symmetrization well contacts lie inside the buffer regions.

In embodiments of the present invention the width (w2 in FIG. 10) of the inner well contacts 14 ranges between 0.5 µm and 1 µm. In embodiments of the present invention the length of the outer well contacts 14 would ideally be infinitely long. This is, however, not required because the region below the outer well contacts is highly resistive. Therefore in embodiments of the present invention the length of the outer well contacts is between 2 µm and 3 µm. The exemplary embodiment illustrated in FIG. 9 and FIG. 10 is a vertical Hall sensor comprising six well contacts with in between these well contacts deep buffer regions 19. The outer symmetrization well contacts 14 are embedded in the outer deep buffer regions 120 to make the sensor electrically symmetrical for current flowing from left to right as explained in the previous paragraph.

Figure 11:
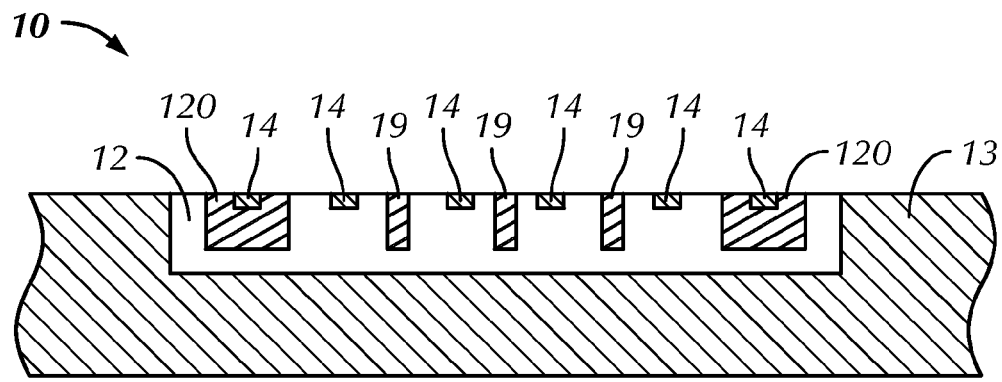
FIG. 11 provides a schematic vertical cross-section of a vertical Hall sensor according to a fifth embodiment of the present invention, with shallow buffer regions, and wherein the outer symmetrization well contacts lie inside the buffer regions.
Figure 12:
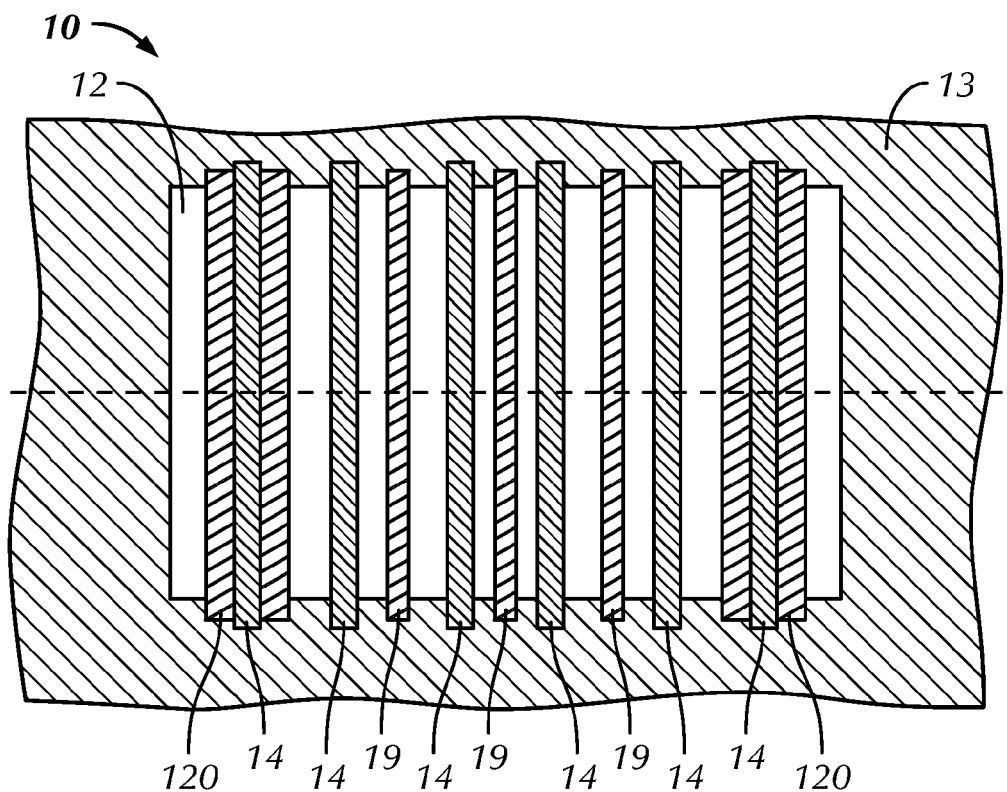
FIG. 12 provides a schematic top view of the vertical Hall sensor of FIG. 11 with shallow buffer regions, and wherein the outer symmetrization well contacts lie inside the buffer regions.

The exemplary embodiment illustrated in FIG. 11 and FIG. 12 is similar as the embodiment illustrated in FIG. 9 and FIG. 10, except for the buffer regions which are shallow in the exemplary embodiment illustrated in FIG. 11 and FIG. 12. These buffer regions 19, in the exemplary embodiment illustrated in FIG. 11 and FIG. 12, are realised with shallow trench isolation. Having shallow buffer regions has the advantage that these buffer regions may be self-aligned and that therefore no position inaccuracy occurs. In embodiments according to the present invention the shallow trench isolation 131 serves as a mask for the implant step for the well contacts 14 and the buffer regions 19 because it is slightly deeper than the implant depth (e.g. the shallow trench isolation has a depth between 0.4 µm and 0.5 µm and the well contacts 14 and buffer regions 19 have a depth between 0.3 µm and 0.4 µm). In FIG. 13 an exemplary embodiment of the present invention is shown wherein shallow trench isolation 131 serves as a mask for the implant step for the well contacts and the buffer regions. In embodiments according to the present invention the first conductivity type (e.g. n+) is implanted over the total sensor area. Only when there is no shallow trench isolation 131 it reaches into the silicon and forms the well contacts 14 and buffer regions 19. In embodiments of the present invention the same first conductivity type (e.g. n+) implant is applied for the well contacts 14 as for the buffer regions 19. It is desired, however, for a Hall sensors to be as uniform as possible.

In embodiments of the present invention the following process steps apply:
applying shallow trench isolation,
applying a first conductivity type (e.g. n+) implant on the regions not covered by the shallow trench isolation.

In embodiments of the present invention the shallow buffer regions and the well contacts are formed simultaneously. Therefore the shallow buffer regions are self-aligned with the well contacts.

In embodiments of the present invention polysilicon 142 may be used instead of shallow trench isolation as a mask for the implant step. In that case polysilicon defines the drift region having an effective distance over which the electrons or holes, depending on the first conductivity type, drift. In embodiments according to the present invention the thickness of the polysilicon is between 0.2 and 0.5 μm. Self-alignment between the shallow buffer regions 19 and the well contacts 14 is obtained by using the same processing steps for the buffer regions and the well contacts and by using the polysilicon as a mask when doping with the first conductivity type. FIG. 14 illustrates an embodiment of the present invention wherein the regions in between the well contacts 14 and the buffer regions 19 and/or the regions outside the outer buffer regions 19 or well contacts 14 are covered with a thin barrier layer, comprising dielectric material, for instance an oxide layer 141, with a polysilicon layer 142 on top. The advantage of polysilicon is that substantially less interface states are present compared to shallow trench isolation where interface states are caused by impurities between the STI oxide 131 and the semiconductor interface. However, when using polysilicon as drift region it is important that the polysilicon is grounded because of the depletion region which affects the symmetry in the Hall sensor. The depletion region is strongly bias dependent and its size is different for a high voltage contact (e.g. 2 V) compared to for a low voltage contact (e.g. 0 V).

In embodiments of the present invention, the buffer regions 19 may be electrically interconnected. In embodiments according to the present invention, the buffer regions 19 are floating.

In embodiments of the present invention, the distance between centers of neighboring buffer regions 19 is the same for all neighboring buffer regions 19. This is for example the case in the embodiment illustrated in FIG. 3 and FIG. 4. This is required for having electrical symmetry. In embodiments of the present invention the distance between neighboring buffer regions 19 ranges between 2 μm and 6 μm, preferably between 3 μm and 5 μm.

In alternative embodiments, the distance between centers of neighboring buffer regions 19 is larger between buffer regions located at extremities of the array of buffer regions than between buffer regions located at the center thereof. This is for example illustrated in the embodiments illustrated in FIG. 1, FIG. 5, FIG. 7, FIG. 9, and FIG. 11.

In embodiments of the present invention the total buffer width between two neighboring well contacts is equal. This also holds for the second and fifth well contacts via the first and sixth well contact in case of a semiconductor chip with six well contacts.

In embodiments of the present invention, the width w, depth d and length (perpendicular to width and depth) dimensions of a buffer region 19 are the same for all buffer regions 19. This is for instance illustrated in the embodiment of FIG. 3 and FIG. 4. In alternative embodiments, some buffer regions 19 may have other dimensions than other buffer regions. For instance in the embodiments illustrated in FIG. 1, and FIG. 5, the first and last buffer regions 19 in the array of buffer regions have a larger width dimension.

In embodiments of the present invention the distance between neighboring well contacts 14 is the same for all neighboring well contacts 14. This is for instance illustrated in the embodiments of FIG. 3 and FIG. 4. It is an advantage of embodiments of the present invention that electrical symmetry can be realized through geometrical symmetry. In embodiments of the present invention the distance between neighboring well contacts 14 ranges between 10 μm and 14 μm, preferably between 11 μm and 13 μm.

In alternative embodiments, the distance between neighboring well contacts 14 is larger between well contacts located at extremities of the array of well contacts than between well contacts located at the center thereof. This is for example illustrated in the embodiments illustrated in FIG. 1, FIG. 5, FIG. 7, FIG. 9, and FIG. 11.

In embodiments of the present invention the dimensions of a well contact 14 are the same for all well contacts 14, as illustrated in all embodiments in the drawings. The present invention, however, is not limited thereto, and different well contacts could have different dimensions.

In embodiments of the present invention the length of the well contacts 14 is larger than the length of the buffer regions 19.

In embodiments of the present invention the width of the buffer regions 19 is wider than the width of the well contacts. The width of the buffer regions 19 is such that the total current from a well contact 14 passes through (one of) the buffer regions 19 neighboring the well contact 14.

In embodiments of the present invention the supply contacts may be configured for being current driven or voltage driven.

In a second aspect, embodiments of the present invention relate to a method for manufacturing a semiconductor chip 10 for measuring a magnetic field based on the Hall effect. In embodiments of the present invention the semiconductor chip 10 is a vertical Hall sensor comprising well contacts 14 and buffer regions 19 in an electrically conductive well 12. The electrically conductive well 12 has a first conductivity type and is embedded in a substrate 13 having the second conductivity type. The well contacts 14 and buffer regions 19 have the first conductivity type. The method comprises at least one processing step for applying the well contacts and the buffer regions 19. In embodiments of the present invention applying the well contacts 14 and the buffer regions 19 is done simultaneously during the same processing step(s). Therefore it is not required to add any additional processing steps when adding the buffer regions 19 to the vertical Hall sensor.

In embodiments of the present invention the method for manufacturing a semiconductor chip 10 for measuring a magnetic field based on the Hall effect may comprise a first step wherein shallow trench isolation is applied. In a following step a first conductivity type implant is applied on the regions not covered by the shallow trench isolation.

In embodiments of the present invention the method for manufacturing a semiconductor chip 10 comprises a first step wherein a thin barrier layer, for instance a thin oxide layer 141, is applied. The applied oxide layer may be smaller than 1 µm, preferably smaller than 0.1 µm, more preferably smaller than 0.04 µm. In a following step a polysilicon layer 142 is applied on top of the thin barrier layer, and selectively removed at locations where an implant is to be applied. In a following step the barrier layer 141 is removed, for instance etched away, in the regions not covered by polysilicon. In a following step a first conductivity type implant is applied on the substrate, and implantation actually takes place only on the regions not covered by the polysilicon. This way, a self-aligned process is carrier out.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

The invention claimed is:

1. A semiconductor chip for measuring a magnetic field based on the Hall effect, the semiconductor chip comprising:
   an electrically conductive well having a first conductivity type, in a substrate having a second conductivity type,
   at least four well contacts arranged at the surface of the well, and having the first conductivity type,
   a plurality of buffer regions interleaved with the well contacts such that at least one of the buffer regions and the electrically conductive well are located between neighboring well contacts, wherein the buffer regions have the first conductivity type, and
   wherein the buffer regions are highly conductive and wherein the buffer region dimensions are such that at least part of the current from a well contact to another well contact transits through one of its neighboring buffer regions.

2. A semiconductor chip according to claim 1, wherein regions in between the well contacts and the buffer regions and/or wherein regions outside outer buffer regions or well contacts are filled with oxide.

3. A semiconductor chip according to claim 1, wherein regions in between the well contacts and the buffer regions and/or regions outside outer buffer regions or well contacts are covered by a thin dielectric layer with a polysilicon layer on top.

4. A semiconductor chip according to claim 1, the semiconductor chip comprising a buffer region outside each outer well contact, wherein the buffer region outside the outer well contacts is having the first conductivity type and is highly conductive, and wherein the buffer region outside each of the outer well contacts is at least as wide as the other buffer regions and wherein the two buffer regions outside each of the outer well contacts are electrically connected together on a floating potential.

5. A semiconductor chip according to claim 1, the semiconductor chip comprising at least 6 well contacts.

6. A semiconductor chip according to claim 1, wherein a distance between a center of a well contact and a closest edge of a neighboring buffer region is between 1.5 µm and 2 µm for the inner contacts.

7. A semiconductor chip according to claim 1, wherein the buffer regions are extending to the same depth into the electrically conductive well as the well contacts.

8. A semiconductor chip according to claim 1, wherein the buffer regions have a width between the width of the well contacts and twice the depth of the electrically conductive well.

9. A semiconductor chip according to claim 1, wherein the buffer regions neighboring outer well contacts form one entire buffer region surrounding the outer well contact.

10. A semiconductor chip according to claim 9, wherein a distance between a nearest edge of a surrounding buffer region and a center of the nearest well contact equals a distance between a center of a well contact and a closest edge of a neighboring buffer region, or 0.1 µm or less smaller.

11. A semiconductor chip according to claim 1, wherein the well contacts are extended using well contact extensions having the first conductivity type.

12. A method for manufacturing a semiconductor chip for measuring a magnetic field based on the Hall effect, wherein applying well contacts and applying buffer regions involves the same processing step or processing steps.

13. A method for manufacturing a semiconductor chip according to claim 12, wherein the method comprises the following steps:
   applying shallow trench isolation,
   applying a first conductivity type implant on the regions not covered by the shallow trench isolation.

14. A method for manufacturing a semiconductor chip according to claim 12, wherein the method comprises the following steps:
   applying a thin dielectric layer,
   applying polysilicon over the dielectric layer,
   etching away the dielectric layer and the polysilicon where the well contacts and the buffer regions will later be formed, and
   applying a first conductivity type implant on the regions not covered by the polysilicon layer.

* * * * *